United States Patent [19]
Baker

[11] Patent Number: 5,493,211
[45] Date of Patent: Feb. 20, 1996

[54] CURRENT PROBE

[75] Inventor: Clifford E. Baker, Hillsboro, Oreg.

[73] Assignee: Tektronix, Inc., Wilsonville, Oreg.

[21] Appl. No.: 92,306

[22] Filed: Jul. 15, 1993

[51] Int. Cl.$^6$ .................................................. G01R 33/00
[52] U.S. Cl. ................................. 324/130; 324/117 H
[58] Field of Search ............................... 324/130, 117 R,
324/117 H, 251, 252; 338/32 H; 307/309;
364/48 D, 481, 571.01, 550, 550.1

[56] References Cited

U.S. PATENT DOCUMENTS

| | | | |
|---|---|---|---|
| 3,475,682 | 10/1969 | Peek | 324/127 |
| 3,525,041 | 8/1970 | Velsink | 324/117 R |
| 4,482,862 | 11/1984 | Leehey | 324/117 R |
| 4,639,665 | 1/1987 | Gary | 324/117 H |
| 4,682,101 | 7/1987 | Cattaneo | 324/117 H |
| 4,901,008 | 2/1990 | Quastel et al. | 324/117 R |
| 5,103,163 | 7/1992 | McLyman | 324/117 H |
| 5,132,608 | 7/1992 | Nishifuji et al. | 324/117 R |
| 5,146,156 | 9/1992 | Marcel | 324/117 R |

Primary Examiner—Vinh P. Nguyen
Attorney, Agent, or Firm—William K. Bucher

[57] ABSTRACT

A current probe comprising a Hall device and a secondary winding in a flux linking relationship with a magnetic circuit is self-calibrated by disconnecting the Hall device from the winding, passing a current through the winding so as to induce a magnetic flux in the magnetic circuit, measuring voltage developed by the Hall device in response to linking by the magnetic flux, calculating the Hall gain of the Hall device, and then adjusting the gain of a scaling output amplifier on the basis of the calculated Hall gain to compensate for variation in Hall gain due to changes in operating conditions.

9 Claims, 3 Drawing Sheets

CURRENT PROBE

BACKGROUND OF THE INVENTION

This invention relates to an improved current probe.

U.S. Pat. No. 3,525,041 discloses a current probe measurement system comprising a ring-shaped core of magnetic material defining an aperture through which a conductor carrying a current to be measured extends. A multi-turn winding is wrapped around one leg of the core. The current to be measured produces a magnetic flux in the core, and the flux in the magnetic core links the winding. Thus, the current-carrying conductor, the core and the multi-turn winding function as a transformer, in which the current-carrying conductor is the primary and the multi-turn winding is the secondary. The flux in the magnetic core also links a thin film semiconductor Hall device, which has a first pair of opposite terminals connected between a bias current source and ground and a second pair of opposite terminals connected between ground and an input of an amplifier. The output of the amplifier is connected to one end of the winding, and the opposite end of the winding is connected to a voltage measurement instrument across a load or termination resistor.

A high frequency component of the current in the primary conductor results in a current being induced in the secondary winding in a direction such as to generate a magnetic field in the core that is opposed to the field created by the current in the primary conductor. A low frequency or DC component of the current in the primary conductor is less effective at inducing current in the secondary winding, but generates a potential difference between the second pair of terminals of the Hall device, and the amplifier provides a corresponding current to the winding. The direction of the current supplied by the amplifier is such that the magnetic field created in the core by the current flowing through the winding is opposite to the direction of the magnetic field created by the current in the primary conductor. Over a wide range of frequencies, the voltage developed across the load resistor is representative of the current in the primary conductor.

FIG. 1 illustrates a practical implementation of the current probe shown in U.S. Pat. No. 3,525,041, for example as applied to current probe measurement system based on the A6302 probe, AM503 plug-in amplifier and TM500 power supply manufactured by Tektronix, Inc. of Wilsonville, Oreg. As shown in FIG. 1, the Hall device 10 provides a differential input signal to a Hall pre-amplifier 14, whose output is applied through a resistor 18 to a power amplifier 22 that is provided with a feedback resistor 26. The output of the power amplifier 22 is connected through one conductor 28 of a cable 30 to one end of the secondary winding 34, and the opposite end of the winding 34 is connected through another conductor 38 of the cable 30 to the non-inverting input terminal of a differential scaling amplifier 50 having its inverting input terminal grounded. A termination resistor 52 is connected between the input terminals of the scaling amplifier 50. Accordingly, the scaling amplifier receives as input signal the voltage developed across the termination resistor, which is proportional to the current provided by the power amplifier. The output voltage of the amplifier 50 is proportional to the input voltage and is applied through a vertical deflection circuit 56 to a cathode-ray tube display device 56. A transformer shunting device 57 may be connected in parallel with the winding 34, and an output shunting device 59 may be connected in parallel with the series combination of the conductor 38 and termination resistor 52.

A generalization of the current probe measurement system shown in FIG. 1 may be represented by a current-responsive system of the form shown in FIG. 2. FIG. 2 shows a current-to-voltage converter 58 that senses the current flowing in the primary conductor 8 and provides a voltage signal that is related to the current Ip by the transfer function T volts/amp. The output signal of the current-to-voltage converter 58 is applied to the scaling amplifier 50 having a gain $A_s$ and providing a voltage output signal $V_o$. The voltage output signal $V_o$ is applied to a voltage-sensitive output device 61 having a sensitivity $S_o$ output units/volt. Accordingly, the overall transfer function of the current-responsive system is $T*A_s*S_o$ output units/amp, and the output value is given by:

$$OUT = I_p * T * A_s * S_o$$

The voltage-sensitive output device might be, for example, a voltage measuring device such as an oscilloscope display mainframe, in which case the output value would be a number of display divisions on the oscilloscope screen, or it might be an analog-to-digital (A/D) converter, in which case the output value would be a number of least significant bits in the output of the A/D converter. However, the current-responsive system is not restricted to the output value being quantized.

It is generally desirable that the overall transfer function of the current-responsive system have a convenient value that is known exactly. In particular, in the case of the output device being an oscilloscope display mainframe it might be desirable that the overall transfer function be a convenient number of display divisions/amp. The value of $S_o$ is usually convenient and known exactly, and the value of $A_s$ can be given a convenient and exactly known value by using precision components in the scaling amplifier. However, the value of T might not be known exactly and might not be convenient.

Referring to FIG. 1, it can be shown that although the ideal transfer function $T_{ideal}$ relating the current in the primary conductor 8 to the voltage developed across the termination resistor 52 is equal to Rt/N volts/ampere and is thus independent of Hall gain of the Hall device 10, the actual transfer function $T_{real}$ is dependent on Hall gain. Hall gain varies significantly depending on operating conditions including temperature and bias current, and therefore the current probe measurement system shown in FIG. 1 is subject to overall measurement errors because of the variation in Hall gain.

The value of $T_{real}$ can be derived implicitly in a calibration sequence, in which a current of known value is passed through the primary conductor 8 and the gain $A_s$ of the scaling amplifier 50 is adjusted so that the current value indicated by the display device 56 is equal to the known value. However, this calibration procedure is subject to the disadvantage that since Hall gain varies significantly depending upon operating conditions, the system must be recalibrated frequently, and particularly whenever the temperature of the Hall device changes significantly. In principle, it would be possible to calculate the value of $T_{real}$, but hitherto it has not been practicable to measure the Hall gain each time the operating conditions change.

SUMMARY OF THE INVENTION

In accordance with a first aspect of the present invention there is provided a method of measuring gain of a magneto-electric converter that is in a flux linking relationship with a magnetic circuit, said method comprising placing the magnetic circuit in a flux linking relationship with an electrically conductive winding having N turns, passing a current $I_a$ through the winding so as to induce a magnetic flux in the magnetic circuit, measuring voltage $V_H$ developed by the magneto-electric converter in response to linking by the magnetic flux, and evaluating $V_H/(I_a*N)$.

In accordance with a second aspect of the present invention there is provided a method of self-calibrating an instrument that is responsive to current flowing in a primary conductor, said instrument comprising a magneto-electric converter and a secondary winding both linked by magnetic flux in a magnetic core, an amplifier means connected to the magneto-electric converter and responsive thereto to provide an output current, and a means connecting the amplifier means to the secondary winding for passing a predetermined proportion of the output current through the secondary winding, said method comprising disconnecting the magneto-electric converter from the amplifier means, applying a voltage stimulus to the amplifier means, measuring the current conducted by the secondary winding, and measuring voltage developed by the magneto-electric converter in response to flux induced in the magnetic core by current in the secondary winding.

In accordance with a third aspect of the present invention there is provided a method of self-calibrating an instrument that is responsive to current flowing in a primary conductor, said instrument comprising a magneto-electric converter and a secondary winding both linked by magnetic flux in a magnetic core, an amplifier means connected to the magnetic-electric converter and responsive thereto to provide an output current, a means connecting the amplifier means to the secondary winding for passing a predetermined proportion of the output current through the secondary winding in opposition to current induced in the secondary winding by flux in the magnetic core, whereby the secondary winding provides an error signal dependent on current flowing in the primary conductor, and scaling means for scaling the error signal in accordance with a predetermined scaling factor that differs from an ideal scaling factor in dependence upon difference between an actual value of the gain of the magneto-electric converter and a nominal value of the gain of the magneto-electric converter, said method comprising disconnecting the magneto-electric converter from the amplifier means, measuring the gain of the magneto-electric converter, and adjusting the gain of the magneto-electric converter to be equal to the nominal gain thereof.

In accordance with a fourth aspect of the present invention there is provided an instrument that provides a voltage output signal in response to current flowing in a primary conductor, said instrument comprising a magnetic core in a flux linking relationship with the primary conductor, whereby flow of current in the primary conductor produces magnetic flux in the core, a magneto-electric converter and an secondary winding both linked by magnetic flux in the magnetic core, an amplifier means, a switch means having a first state in which it connects the magneto-electric converter to the amplifier means, whereby the amplifier means is responsive to the magneto-electric converter to provide an output current, and a second state in which the switch means isolates the magneto-electric converter from the amplifier means, a conductor means connecting the amplifier means to the secondary winding for passing a predetermined proportion of the output current through the secondary winding, a stimulus means operative when the switch means is in the second state to apply a voltage stimulus to the amplifier means, and an output means operative when the switch means is in the second state for providing an output dependent on voltage developed by the magneto-electric converter in response to flux produced in the magnetic core by current in the secondary winding.

BRIEF DESCRIPTION OF THE DRAWINGS

For a better understanding of the invention, and to show how the same may be carried into effect, reference will now be made, by way of example, to the accompanying drawings in which.

In the different figures of the drawings, like reference numerals represent corresponding components.

DETAILED DESCRIPTION

Figure 3:
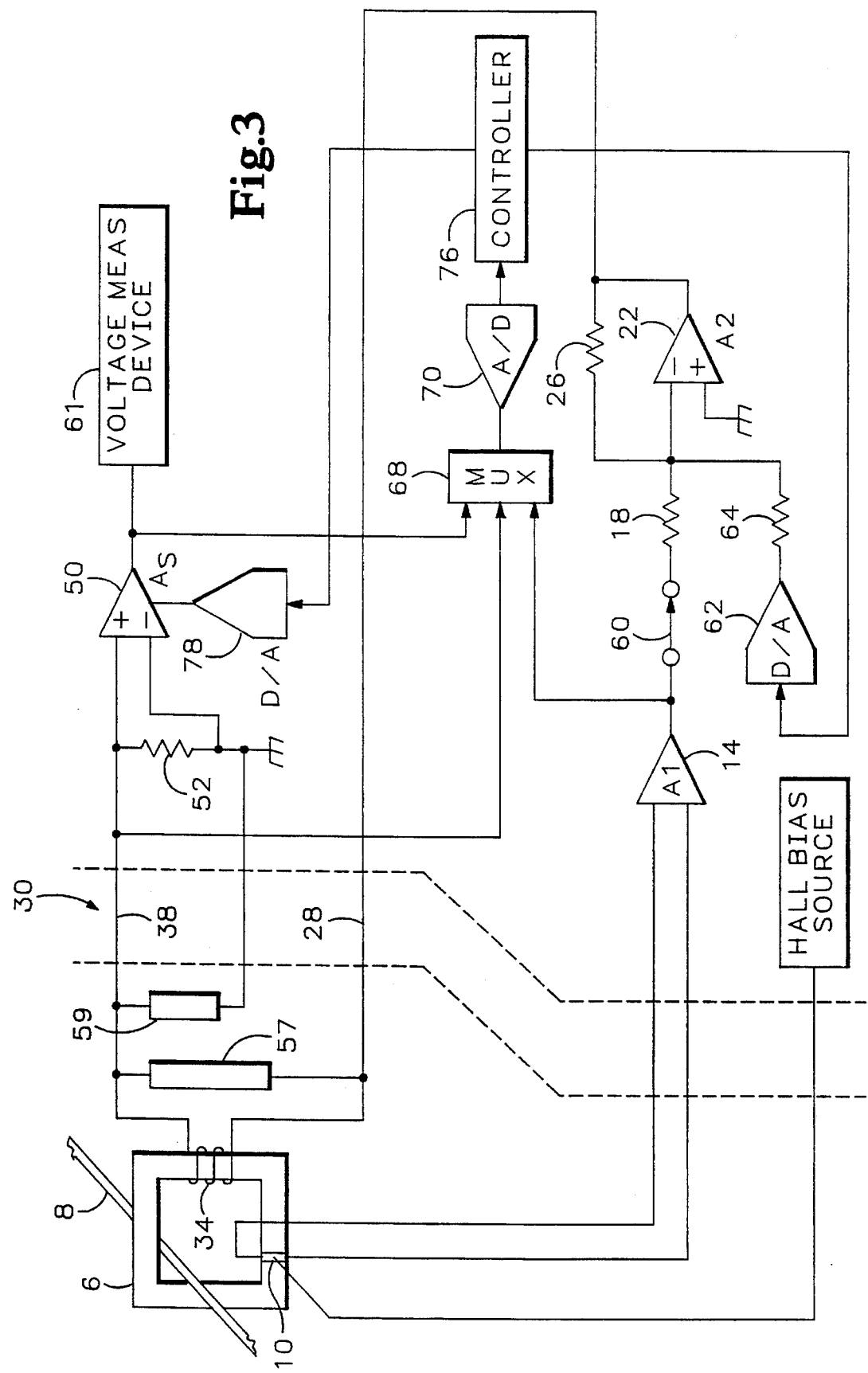
FIG. 3 is a block diagram of a current probe measurement system in accordance with the present invention.

In the current probe measurement system shown in FIG. 3, a 3:1 multiplexer 68 is operative selectively to connect either the output of the Hall pre-amplifier 14 or the non-inverting input of the amplifier 50 or the output of the amplifier 50 to an analog-to-digital (A/D) converter 70. The output of the A/D converter is connected to a microprocessor-based controller 76, which calculates the voltage at the selected input of the multiplexer 68 based on the digital output signal of the A/D converter 70. The controller 76 provides a scaling digital code to a digital-to-analog (D/A) converter 78, whose output is connected to a gain control input of the amplifier 50, and provides a digital code to a second D/A converter 62, whose output is connected through a resistor 64 to the inverting input of the amplifier 22. An electronic switch 60 is provided between the output of the Hall pre-amplifier 14 and the resistor 18.

The system shown in FIG. 3 can be self calibrated, i.e. calibrated without use of an external calibration signal, by the following procedure.

The switch 60 is opened (rendered non-conductive) so as to open the loop containing the Hall device and the multiplexer 68 is set to select the output of the amplifier 50. The controller 76 applies digital codes to the D/A converter 62 such as to apply equal and opposite voltage levels to the inverting input of the amplifier 22 through the resistor 64, and the digital code that results in the amplifier 50 having a zero volts output is determined. When this balancing digital code is applied to the D/A converter 62, the power amplifier 22 is in a balanced state, i.e. a state in which the output of the power amplifier is linearly related to the output of the Hall pre-amplifier 14 without offset.

The core 6 is then degaussed in order to reduce the residual flux, if any, in the core to zero. This is accomplished by applying digital codes to the D/A converter 62 such that the power amplifier 22 applies a decaying pseudo-sinusoidal degaussing current to the winding 34. The digital codes are selected so that the sinusoidal voltage applied to the inverting input of the amplifier 22 is symmetrical about the voltage level determined in the balancing step.

After degaussing the core, and when the probe is at the temperature at which the measurement will made, but before making a measurement and before placing the conductor 8 within the aperture defined by the core 6, the controller 76 measures the gain $A_s$ of the amplifier 50. This is done by applying a digital code to the D/A converter 62 such as to cause the power amplifier 22 to generate a current of which the magnitude is a significant proportion of the magnitude of the maximum current that would be produced by the amplifier 22 during the normal current measurement operation. The multiplexer 68 first selects the input terminal of the amplifier 50 and the A/D converter 70 measures the input voltage of the amplifier. The multiplexer 68 then selects the output terminal of the amplifier 50 and the A/D converter 70 measures the output voltage of the amplifier. The controller 76 calculates the gain of the amplifier and if necessary adjusts the scaling digital code until $A_s$ is equal to a desired value.

When the gain of the measurement amplifier has been set to the desired value, and while the switch 60 is still open, the controller applies calibration codes to the D/A converter 62. The calibration codes are selected to be symmetrical about the code that is provided in order to balance the operation of the power amplifier. The D/A converter 62 responds to the calibration codes by providing a voltage stimulus to the inverting input of the power amplifier 22, which provides current $I_a$ through the winding 34. This current develops a voltage $V_{rt}$ across the termination resistor 52. The multiplexer 68 is set to select the input of the amplifier 50, and A/D converter 70 measures the voltage $V_{rt}$. The multiplexer 68 is then set to select the output of the Hall pre-amplifier 14, and the A/D converter 70 measures the output voltage $V_h$ of the Hall pre-amplifier.

It can be shown that the Hall gain K of the Hall device 10, measured in volts per ampere turn in the core 6, is given by $$K = \frac{V_h * R_t}{V_{rt} * N * A1} \text{ volts/ampere turn} \quad \text{Eq. 1}$$

and that the actual transfer function $T_{real}$ is given by:

$$T_{real} = \frac{R_t * C * K * A1 * A2}{((R_t + Z) * C + Z + N * Q * K * A1 * A2)} \text{ volts/ampere} \quad \text{Eq. 2}$$

where $R_t$ is the resistance of the termination resistor 52, C is the fraction of the output current of the power amplifier 22 that flows through the termination resistor, A1 is the gain of the Hall pre-amplifier 14, A2 is the gain of the power amplifier 22, 2*Z is the resistance between the output of the power amplifier 22 and the non-inverting input terminal of the amplifier 50 (it being assumed that half of this resistance is between the mid-point of the winding 34 and the output of the power amplifier 22 and the other half of this resistance is between the mid-point of the winding 34 and the non-inverting input terminal of the amplifier 50), N is the number of turns in the secondary winding 34, and Q is the fraction of the current provided by the power amplifier 22 that flows through the secondary winding 34.

The controller 76 calculates the Hall gain K from Eq.1, and substitutes this value into Eq.2 in order to calculate the value of $T_{real}$. It will be understood from Eq. 2 that $T_{real}$ is strongly dependent on $R_t$, and therefore it is desirable that $R_t$ be known with a high degree of precision. The controller calculates an error factor E equal to $(T_{ideal} - T_{real})/T_{ideal}$, representing the difference between the ideal transfer function and the real transfer function as a fraction of the ideal transfer function.

The controller then adjusts the scaling digital code applied to the D/A converter 78 to compensate for the difference between the ideal transfer function and the real transfer function, so that the adjusted value $A_{s(final)}$ of the gain of the scaling amplifier 50 is equal to $A_s/(1-E)$. The calibration procedure is now complete, and the overall transfer function of the current probe measurement system is given by $$T_o = T_{real} * A_{s(final)} * S_o$$

Substituting for $A_{s(final)}$ and E provides $$T_o = T_{ideal} * A_s * S_o$$

In this fashion, the current probe measurement system emulates an ideal system without need to calibrate by reference to a standard current source. The calibration procedure can be performed quickly and easily, and in particular can be performed whenever the ambient temperature to which the Hall device is exposed changes.

Figure 1:
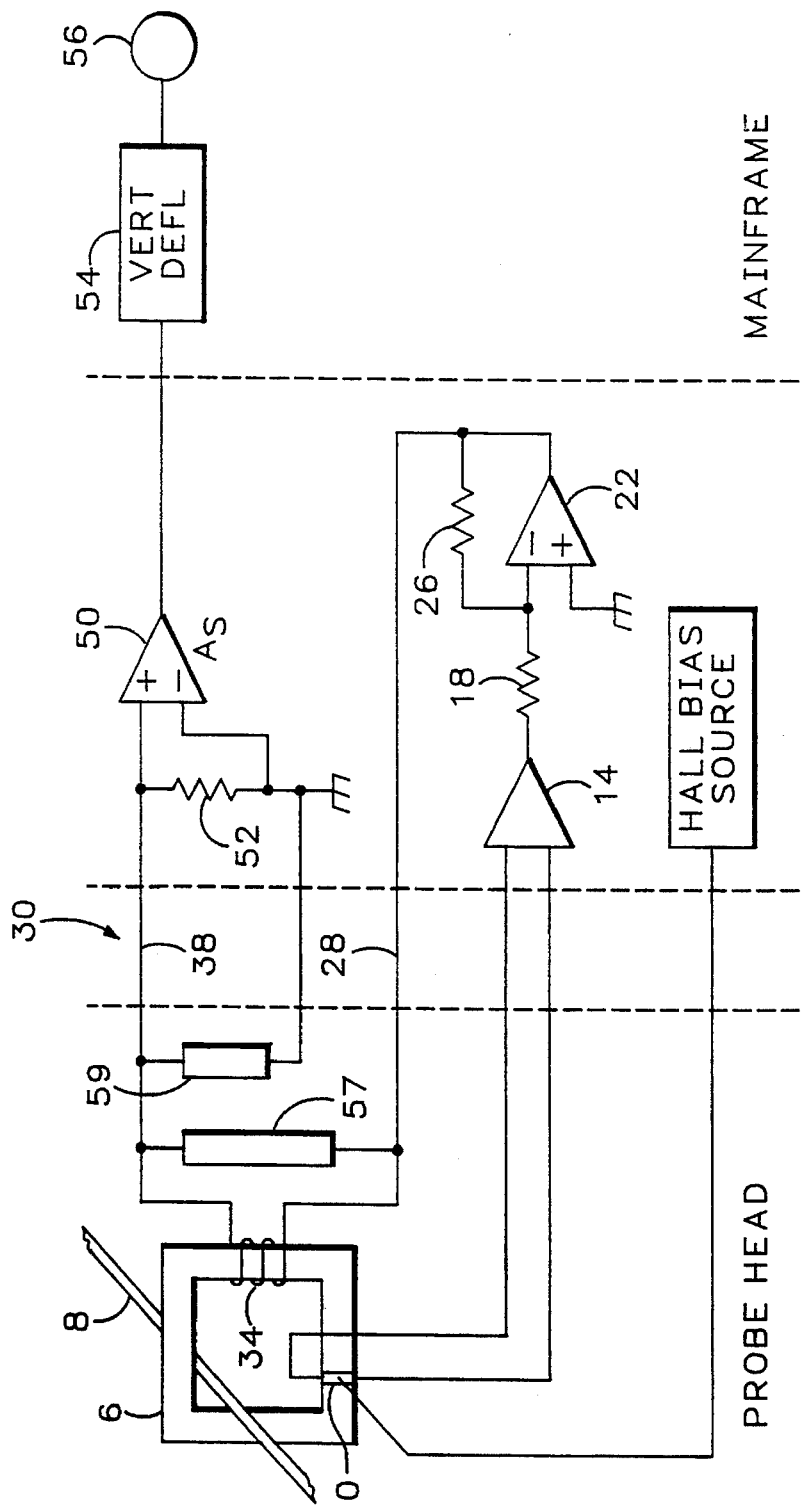
FIG. 1 is a block diagram of a known current probe measurement system.
Figure 2:
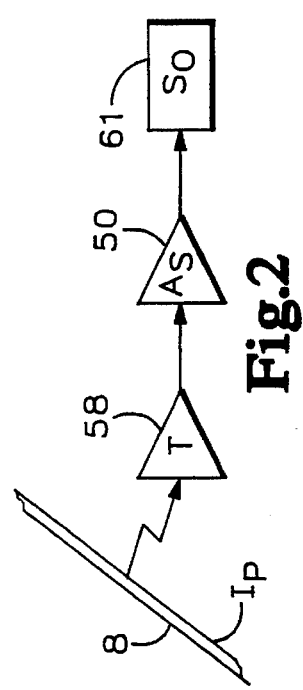
FIG. 2 is a generalized representation of the current probe measurement system shown in FIG. 1.

In an implementation of the current probe meaurement system shown in FIG. 1, it might be desired that if the transfer function $T_{real}$ were equal to the ideal transfer function $T_{ideal}$, then the gain of the amplifier 50 should be equal to exactly $A_{s(ideal)}$. However, based on Eq. 2 and a nominal value $K_{nominal}$ of the Hall gain K, it might be determined that the actual transfer function $T_{real}$ is in fact equal to $(1-E')*T_{ideal}$, where E' is an error factor. In order to compensate for this error in $T_{real}$, the actual gain $A_{s(real)}$ the scaling amplifier 50 is set to $(1+E')*A_{s(ideal)}$. However, the actual Hall gain $K_{real}$ of the Hall device might differ significantly from the nominal Hall gain $K_{nominal}$ due to manufacturing variations and operating conditions, so that $T_{real}$ is not equal to $(1-E')*T_{ideal}$. The current probe measurement system shown in FIG. 4 controls the Hall gain so that the actual transfer function $T_{real}$ compensates for the difference between $A_{s(real)}$ and $A_{s(ideal)}$.

Figure 4:
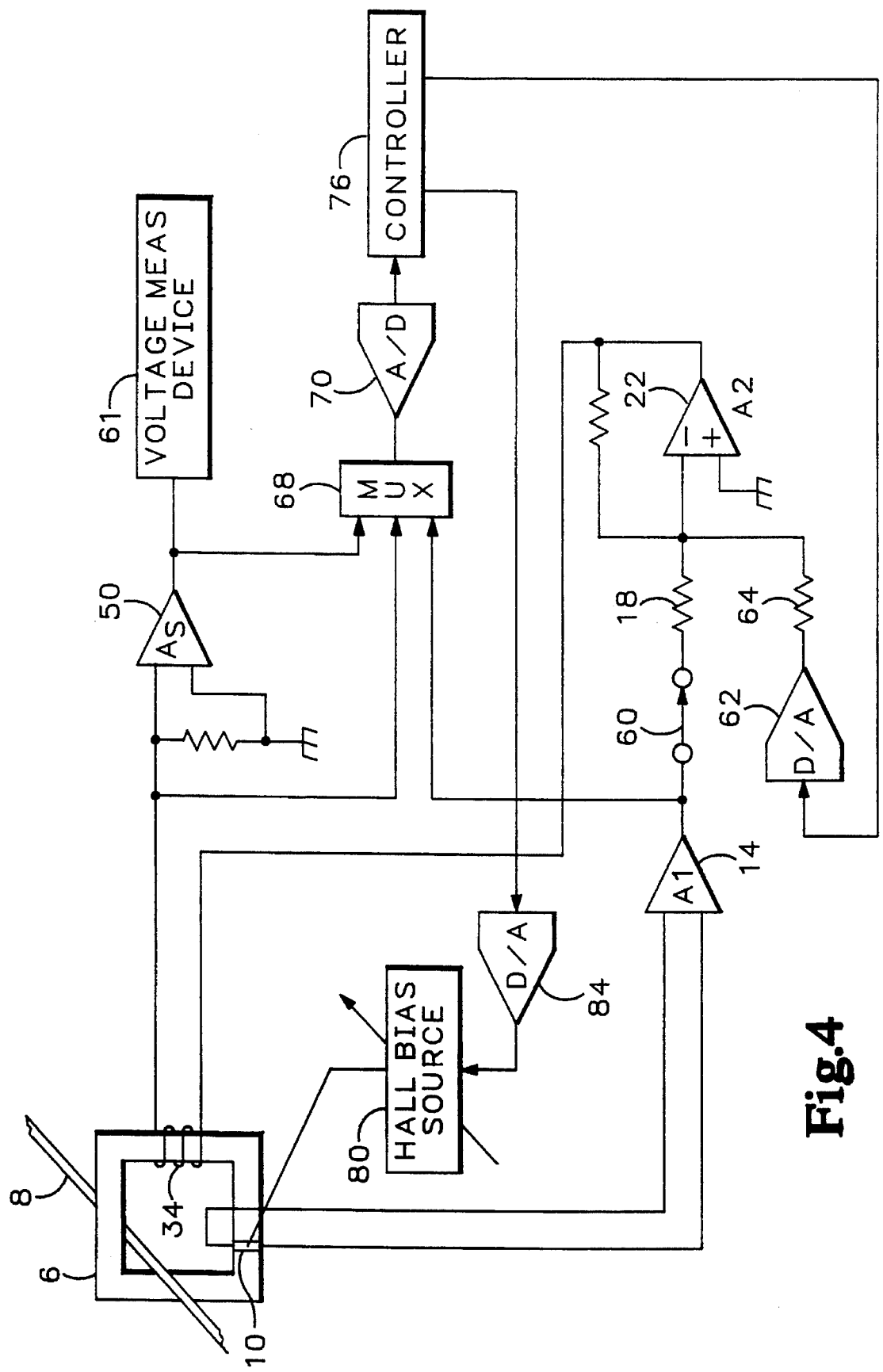
FIG. 4 is a block diagram of a second current probe measurement system in accordance with the present invention.

The current probe measurement system shown in FIG. 4 has a Hall bias source 80 that is adjustable with respect to the magnitude of the bias current applied to the Hall device and/or with respect to the magnitude of the voltage with which the bias current is supplied. Adjustment is effected in response to an analog signal that is applied to a conrol input of the Hall bias source by a D/A converter 84 that receives bias control digital codes from the controller 76.

The system shown in FIG. 4 is self-calibrated by a procedure of which the initial steps are the same as those of the procedure described with reference to FIG. 3. Thus, the digital code required to balance the power amplifier 22 is measured, core 6 is degaussed and the actual gain $A_{s(real)}$ of the amplifier 50 is measured. Also, with the switch 60 still open, the Hall gain is measured for several bias control digital codes applied to the D/A converter 84 and the controller 76 determines the code that would result in the Hall gain being equal to $K_{nominal}$. Finally, after adjusting the bias, the Hall pre-amplifier 14 is balanced by a procedure similar to that described with reference to FIG. 3 for the power amplifier 22. Since the Hall gain K is equal to the nominal value $K_{nominal}$, in the normal current measurement operation, the transfer function $T_{real}$ is equal to $(1-E')*T_{ideal}$ and the actual gain of the scaling amplifier is properly matched to the actual transfer function.

It will be appreciated that the invention is not restricted to the particular embodiments that have been described and illustrated, and that variations may be made therein without departing from the scope of the invention as defined in the appended claims and equivalents thereof. For example, although the invention has been described in the context of a semiconductor Hall device, it is also applicable to other magneto-electric converters, such as a device that employs the Faraday effect to rotate the plane of polarization of a light beam in response to magnetic flux and provides a voltage output signal dependent on the angle of the plane of polarization. Further, in the case in which the output signal of the magneto-electric converter is a current signal, it is not essential to the invention that a voltage signal be developed by use of a differential scaling amplifier to detect the voltage drop across a termination resistor, since a transimpedance amplifier may be used instead to develop a voltage output signal in response to a current input signal.

I claim:

1. A self-calibrating current probing device having a transfer function that provides a voltage output signal in response to current flowing in a primary conductor, said current probing device comprising:

a magnetic core in a flux linking relationship with the primary conductor, whereby flow of current in the primary conductor produces magnetic flux in the core, a magneto-electric converter and a secondary winding being linked by the magnetic flux in the magnetic core with the magneto-electric converter disposed within the magnetic core in a plane substantially perpendicular to the magnetic flux in the core and including a preamplifier, the magneto-electric converter responsive to the magnetic flux in the magnetic core for generating an amplified output and the secondary winding responsive to the current flow in the primary conductor, a power amplifier having an input selectively coupled to receive the amplified output from the magneto-electric converter for generating a current output coupled to the secondary winding, an output amplifier having a termination resistor coupled in series with the secondary winding, the output amplifier producing a voltage output in response to current flowing through the termination resistor, a first switch having a first state in which it connects the magneto-electric converter to the power amplifier, whereby the power amplifier is responsive to the amplified magneto-electric converter output to provide an output current in response to current flowing in the primary conductor, and a second state in which the switch isolates the amplified magneto-electric converter output from the power amplifier during self-calibration of the probing device, a controller for generating digital codes for balancing the power amplifier, determining gains for the magneto-electric converter and the output amplifier, and scaling the output amplifier as a function of a calculated error factor determined by the difference between an ideal and a real transfer function for the current probing device as a fraction of the ideal transfer function for calibrating the current probing device, with the balancing digital codes and the gain determining codes being coupled to the input of the power amplifier via a digital-to-analog converter, and the scaling digital codes being coupled to the output amplifier via a digital-to-analog converter, and a second switch coupled to receive the amplified magneto-electric converter output, the output developed across the termination resistor, and the output voltage of the output amplifier and selectively operating to couple the respective outputs to the controller via an analog-to-digital converter for determining the balancing code for the power amplifier, the gains of the magneto-electric converter and the output amplifier and the scaling codes for the output amplifier.

2. The self-calibrating current probing device as recited in claim 1 further comprising digital codes generated by the controller and coupled to the power amplifier for producing a decaying pseudo-sinusoidal degaussing current applied to the secondary winding.

3. The self-calibrating current probing device as recited in claim 1 wherein the balancing codes generated by the controller produce a zero output from the output amplifier.

4. The self-calibrating current probing device as recited in claim 1 wherein the gain determining codes for the output amplifier generated by the controller produce a current from the power amplifier of which the magnitude is a significant portion of the magnitude of the maximum current produced by the power amplifier during normal current measuring operations.

5. The self-calibrating current probing device as recited in claim 1 wherein the magneto-electric converter is a Hall device responsive to the magnetic flux in the magnetic core for generating an output coupled to the preamplifier.

6. A method of self-calibrating a current probing device having a transfer function that provides a voltage output in response to current flowing in a primary conductor, said current probing device having a magneto-electric converter and a secondary winding having N turns being linked by magnetic flux in a magnetic core with the magneto-electric converter disposed within the magnetic core in a plane substantially perpendicular to the magnetic flux in the core and including a preamplifier having a gain A1, the magneto-electric converter responsive to the magnetic flux in the magnetic core for generating an amplified output, a power amplifier connected to receive the amplified magneto-electric converter output and responsive thereto for providing an output current through the secondary winding, and an output amplifier having a termination resistor $R_t$ coupled in series with the secondary winding, the output amplifier producing a voltage output in response to current flowing through the termination resistor, said method comprising:

a) disconnecting the magneto-electric converter from the power amplifier using a first switch having a first state in which it connects the amplified magneto-electric converter output to the power amplifier, whereby the power amplifier is responsive to the amplified magneto-electric converter output to provide an output current in response to current flowing in the primary conductor, and a second state in which the switch isolates the amplified magneto-electric converter output from the power amplifier during self-calibration of the probing device, b) applying a voltage stimulus to the power amplifier via a digital-to-analog converter coupled to a controller generating digital codes for generating a current output $I_a$ therefrom, c) measuring the voltage $V_{rt}$ across the termination resistor $R_t$ of the output amplifier in response to the current $I_a$ conducted by the secondary winding using a second switch coupled to receive the output developed across the termination resistor, the output of the output amplifier, and the amplified magneto-electric converter output, and selectively operating to couple the respective outputs to the controller via an analog-to-digital converter, d) measuring the amplified magneto-electric converter output in response to flux induced in the magnetic core by current $I_a$ in the secondary winding, and e) generating digital codes in response to the values measured in steps (c) and (d) for scaling the output amplifier as a function of a calculated error factor determined by the difference between an ideal and a real transfer function for the current probing device as a fraction of the ideal transfer function for calibrating the current probing device, the scaling digital codes being coupled to the output amplifier via a digital-to-analog converter.

7. The method according to claim 6 comprising the preliminary step of:

a) balancing the power amplifier as a function of applying a voltage stimulus to the power amplifier using digital codes from the controller for producing a zero output from the output amplifier, b) degauss the magnetic core by applying a voltage stimulus to the power amplifier using digital codes from the controller to produce a decaying pseudo-sinusoidal degaussing current applied to the secondary winding, and c) measuring the gain of the output amplifier by applying a voltage stimulus to the power amplifier using digital codes from the controller to produce a current output from the winding and measuring the output voltage of the output amplifier and the voltage across the termination resistor of the output amplifier.

8. The method according to claim 6 for measuring gain K of the magneto-electric converter in steps (c) and (d) further comprising the steps of:

a) passing the current $I_a$ through the secondary winding and the termination resistor $R_t$ so as to induce a magnetic flux in the magnetic core and a voltage drop across the termination resistor, b) measuring the amplified magneto-electric converter voltage $V_h$ in response to linking by the magnetic flux and the voltage $V_{rt}$ across the termination resistor, and c) evaluating $(V_h * R_t)/(V_{rt} * N * A1)$ for the gain K of the magneto-electric converter.

9. The method according to claim 8, wherein the magneto-electric converter is a Hall device.

* * * * *